(12) United States Patent
Ding et al.

(10) Patent No.: US 9,386,690 B2
(45) Date of Patent: Jul. 5, 2016

(54) FIRST AND SECOND DIFFERENTIAL INTERCONNECTS HAVING INTERLEAVED STUB TRACES

(71) Applicant: Intel Corporation, Santa Clara, CA (US)

(72) Inventors: Ruihua Ding, San Jose, CA (US); Min Wang, Santa Clara, CA (US); Mo Liu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 14/228,002

(22) Filed: Mar. 27, 2014

(65) Prior Publication Data

US 2015/0280778 A1   Oct. 1, 2015

(51) Int. Cl.

| | |
|---|---|
| H05K 1/02 | (2006.01) |
| H01P 3/04 | (2006.01) |
| H04B 3/32 | (2006.01) |
| H05K 3/10 | (2006.01) |
| H01P 3/02 | (2006.01) |
| H01P 1/203 | (2006.01) |

(52) U.S. Cl.
CPC ............. *H05K 1/0245* (2013.01); *H01P 3/026* (2013.01); *H01P 3/04* (2013.01); *H04B 3/32* (2013.01); *H05K 3/10* (2013.01); *H01P 1/203* (2013.01); *Y10T 29/49155* (2015.01)

(58) Field of Classification Search
CPC .......... H05K 1/0245; H01P 3/026; H01P 3/04
USPC ...................................... 333/1, 4, 5
See application file for complete search history.

(56) References Cited

U.S. PATENT DOCUMENTS

| | | | |
|---|---|---|---|
| 6,686,808 B1 * | 2/2004 | Sugawara et al. ................ 333/1 |
| 7,405,634 B2 * | 7/2008 | Mobley et al. .................... 333/1 |
| 2006/0261905 A1 * | 11/2006 | Ham et al. ............... 331/107 SL |
| 2010/0327989 A1 * | 12/2010 | Abbott et al. ..................... 333/1 |
| 2011/0030997 A1 * | 2/2011 | Hsu ............................. 174/254 |

* cited by examiner

*Primary Examiner* — Benny Lee
(74) *Attorney, Agent, or Firm* — Schwegman Lundberg & Woessner, P.A.

(57) ABSTRACT

This disclosure relates generally to an electronic assembly and method having a first electrical connection point and a second electrical connection point and a differential interconnect coupling the first electrical connection point to the second electrical connection point, the differential interconnect including first and second transmission traces including a interior edges and a exterior edges opposite the interior edges, the second interior edge facing the first interior edge, and stub traces, each stub trace coupled to one of the first and second transmission traces and projecting from one of the first interior edge, the first exterior edge, the second interior edge, and the second exterior edge. A substantially equal number of stub traces project from the first exterior edge and the second exterior edge. At least twice as many stub traces project from the first and second exterior edges as project from the first and second interior edges.

18 Claims, 5 Drawing Sheets

FIRST AND SECOND DIFFERENTIAL INTERCONNECTS HAVING INTERLEAVED STUB TRACES

TECHNICAL FIELD

The disclosure herein relates generally to structures to reduce crosstalk on differential pair interconnects and related methods therefor.

BACKGROUND

Crosstalk is a well-known consequence of placing electrically-conductive lines in relatively close proximity of one another. While differential transmission line design helps reject common mode noise such as far-end crosstalk (FEXT), the level of FEXT could still be substantial at high operational frequencies. While crosstalk may not necessarily render a transmission line or an interconnect in general ineffective, such crosstalk may, for instance, reduce a data rate at which such interconnects may transmit data.

DETAILED DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

An interconnect may include one or more transmission lines, vias, and so forth. FEXT on interconnects has been addressed using a variety of mechanisms. For instance, an interconnect that is formed having a transmission line forming an elongate copper trace may have short copper traces or "stub traces" extending substantially orthogonal to each side of the elongate copper trace. The stub traces may create a capacitive coupling effect that offsets the inductive coupling effect that may occur between proximate interconnects.

However, while such arrangements of stub traces have proven effective on single-trace interconnects, the stub traces have proven ineffective and indeed detrimental to the performance of differential interconnects. Consequently, while single-trance interconnects have utilized stub traces, differential interconnects have addressed crosstalk by such mechanisms as increasing spacing between the differential interconnect pairs, decreasing a thickness of a substrate on which the differential interconnects are positioned, or routing the differential interconnects on stripline layers. These mechanisms, however, result in increased space consumption by the differential interconnects, causing increased size of the electronic components and resultant increased cost.

An arrangement of stub traces has been discovered for differential interconnects that provides at least some, and in various examples essentially all of the benefits of stub traces in single-trace interconnects. In particular, stub traces are positioned to project substantially perpendicular from the exterior edge of each of the individual transmission traces of the differential interconnect but with few or none extending from the interior edge of each of the individual transmission traces. That is to say, rather than the stub traces projecting uniformly from both the interior and exterior edges of each of the transmission traces, the stub traces favor projecting from the exterior edge, thus providing the offsetting capacitive coupling between proximate interconnects while limiting detrimental effects between the individual transmission traces of the differential interconnect.

Figure 1:
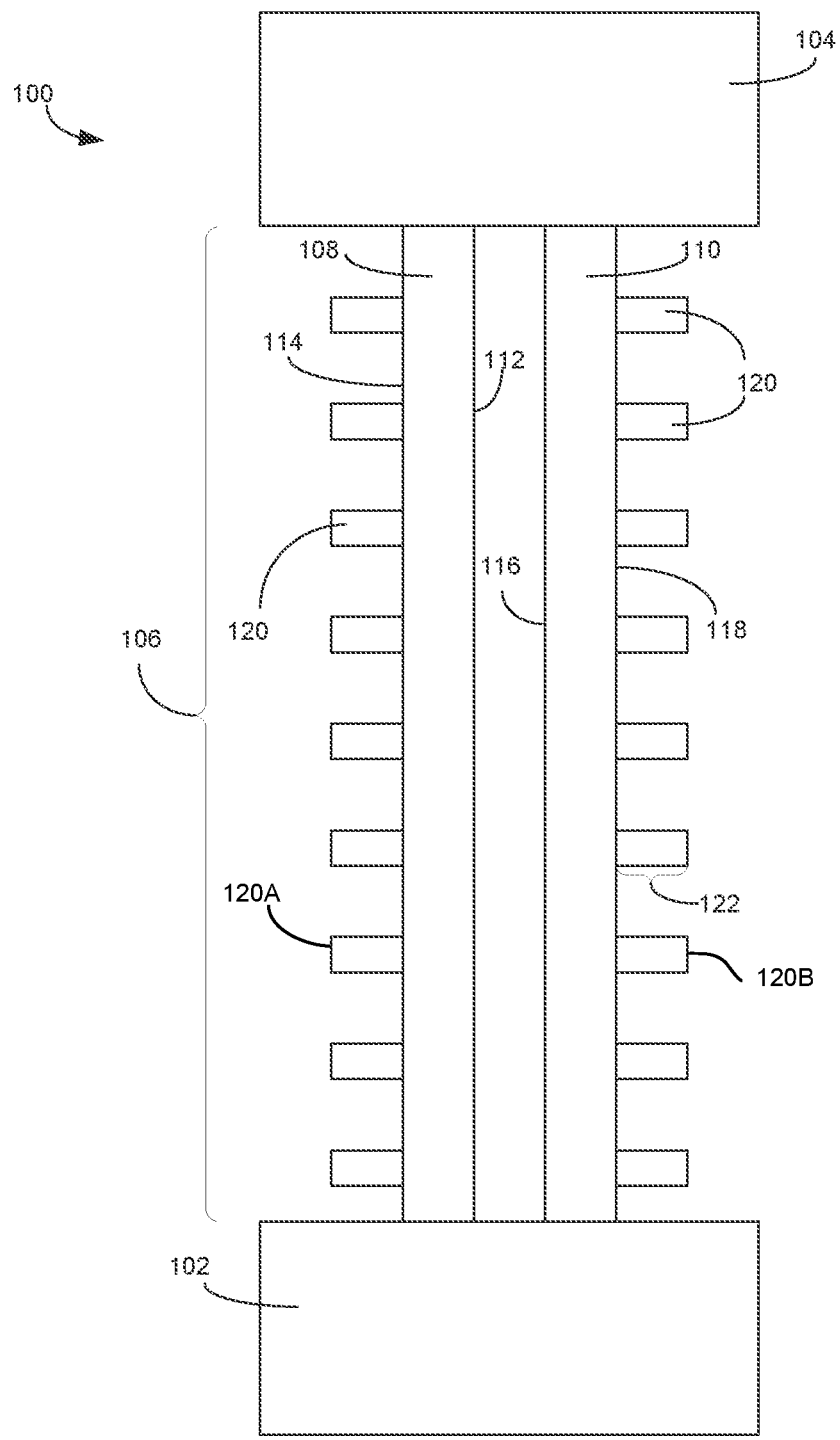
FIG. 1 is an abstract view of an electronic assembly, in an example embodiment.

FIG. 1 is an abstract view of an electronic assembly 100, in an example embodiment. The electronic assembly 100 may be or include any of a variety of electronic assemblies known in the art, such as a printed circuit board (PCB) or a chip package, among other such assemblies. The electronic assembly 100 may be in any of a variety of conditions of manufacture, including before being populated with individual electronic components, such as chips and discrete components.

The electronic assembly 100 includes a first electrical connection point 102 and a second electrical connection point 104. The electrical connection points 102, 104 may be pads to which electrical contacts may be soldered or otherwise secured, locations on which such pads may be formed, electrical contacts of electronic components themselves, or any structure or area configured to receive a structure that may provide or facilitate contact with and/or coupling to an electronic component. The electrical connection point may include one or more discrete connection points that may be coupled together via a differential interconnect (below). Thus, the electronic assembly 100 may be anywhere from a PCB in various states of development to a fully assembled electronic product.

Figure 2:
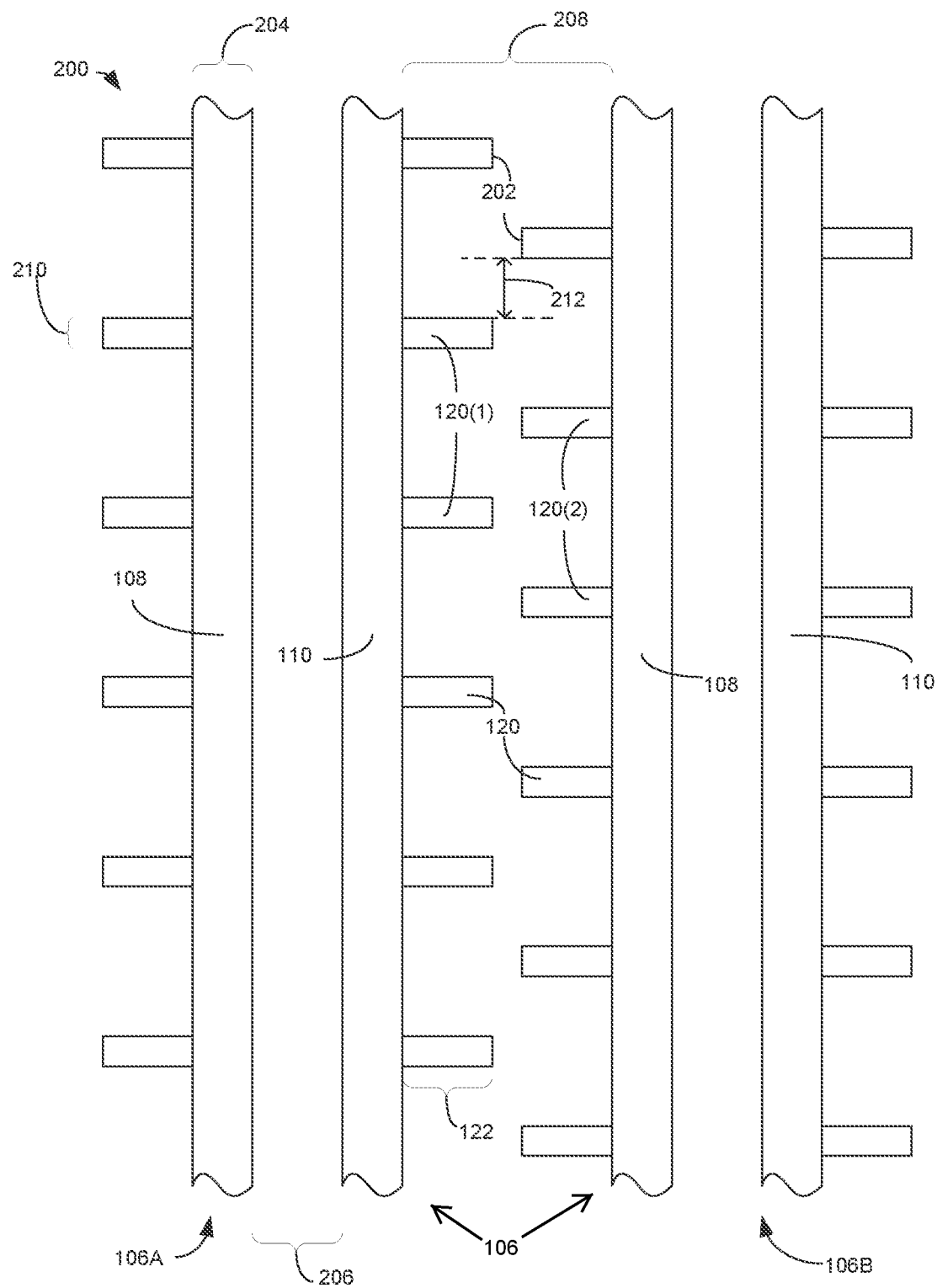
FIG. 2 is an illustration of a portion of an electronic assembly including multiple differential interconnects, in an example embodiment.

The first and second electrical connection points 102, 104 are coupled to one another via a differential interconnect 106, which is also shown in FIG. 2. The differential interconnect 106 may function to transmit electrical signals between the first and second connection points 102, 104 in a manner similar to that of a conventional differential interconnect. The differential interconnect 106 includes a first transmission trace 108 and a second transmission trace 110. The transmission traces 106, 108 are substantially parallel to one another according to tolerances that may be applied to differential interconnects known in the art. The transmission traces 108, 110 may be formed form copper or other conductive material.

The first transmission trace 108 includes an interior edge 112 facing the second transmission trace 110 and an exterior edge 114 opposite the interior edge 112. The second transmission trace 110 includes an interior edge 116 facing the first transmission trace 108 and an exterior edge 118 opposite the interior edge 116. Thus, the interior edges 112, 116 face one another along the length of the differential interconnect 106 while the exterior edges 114, 118 face away from one another along the length of the differential interconnect 106.

The differential interconnect 106 further includes stub traces 120. The stub traces 120 may be formed of the same material as the transmission traces 108, 110. The stub traces 120 are shorter than and substantially orthogonal to the transmission traces 108, 110. While the stub traces 120 may aid in the conduction of electrical signals on the transmission traces 108, 110, the stub traces 120 themselves may be open-ended and thus may not, in various examples, transmit electrical signals to any deliberate destination. Rather, the stub traces 120 may form capacitive coupling with respect to other stub traces 120 on other differential interconnects 106, thereby offsetting, at least in part, inductive coupling between the differential interconnects 106 that may result in FEXT.

In the illustrated example, the stub traces 120 extend only from the exterior edges 114, 118 of the transmission traces. The use of stub traces 120 only on the exterior edges 114, 118 may, in various circumstances, provide the most reduction in FEXT over examples that include stub traces 120 extending form the interior edges 112, 116. However, one or more stub traces 120 may extend from the interior edges 112, 116 and still provide acceptable levels of FEXT. In various examples, one or more stub traces 120 may extend from the interior edges 112, 116. However, in such examples, fewer stub traces 120 may extend from the interior edges 112, 116 as may extend from the exterior edges 114, 118. In various examples, at least twice as many stub traces 120 extend from the exterior edges 114, 118 as from the interior edges 112, 116.

As illustrated, the stub traces 120 are symmetric between the transmission traces 108, 110, with each stub trace 120A on the first transmission trace 108 paired with a stub trace 120B substantially directly laterally across on the second transmission trace 110. In various examples, the stub traces 120A, 120B may be laterally offset with respect to one another between the transmission traces 108, 110. In an example, the stub traces 120A, 120B may be offset by half, with the stub trace 120B offset from the stub trace 120A by half the distance between adjacent stub traces 120 on the same transmission trace, such as the first transmission trace 108. Alternative offsets between stub traces 120 are contemplated.

In the illustrated example, stub traces 120 have a substantially equal length 122 among all of the stub traces 120. In various examples, the stub traces 120 may be of varying lengths 122. Additionally, further traces may extend from the transmission traces 108, 110 without necessarily being stub traces 120. Such further traces may be understood as being distinct from stub traces 120 if the further traces are not open-ended, if the stub traces 120 are substantially orthogonal to the transmission traces 108 and the further traces are not, or if the stub traces 120 are of substantially equal length and the further traces are not, among other potentially identifying characteristics.

FIG. 2 is an illustration of a portion of an electronic assembly 200 including multiple differential interconnects 106A and 106B, in an example embodiment. While the electronic assembly 200 is illustrated with the differential interconnects 106A and 106B, it is to be understood that the differential interconnects 106A and 106B of the electronic assembly 200 may incorporate any of the various configurations for differential interconnects 106A and 106B described herein.

As illustrated the stub traces 120 between the differential interconnects 106A and 106B are interleaved with respect to one another. That is to say, the stub traces 120(1) on the first differential interconnect 106A facing the second differential interconnect 106B are offset by half relative to the stub traces 120(2) of the second differential interconnect 106B facing the first differential interconnect 106A. The ends 202 of the stub traces 120 are not illustrated as extending past one another. Alternatively, the ends 202 of the stub traces 120(1) extend past the ends 202 of the stub traces 120(2) for additional interleaving.

In an example, the differential interconnects 106A and 106B include the following dimensions. A transmission trace width 204 of the transmission traces 108, 110 is approximately five (5) mil, wherein one (1) mil is equal to $2.54 * 10^{-5}$ meters, i.e., one (1) milli-inch, A transmission trace separation 206 between the transmission traces 108, 110 within the same differential interconnect 106A or 106B is approximately seven (7) mil. A transmission trace separation 208 between adjacent transmission traces 108, 110 of adjacent differential interconnects 106A and 106B is approximately twenty (20) mil. A stub trace width 210 of the stub traces 120 is approximately three (3) mil. A stub trace length 122 of the stub traces 120 is approximately 8.7 mil. A stub trace separation 212 between adjacent stub traces 120 between the differential interconnects 106A and 106B is approximately twelve (12) mil.

The dimensions detailed above are exemplary only and non-limiting. Differential interconnects 106A and 106B may be built according to any of a variety of dimensions. The dimensions described herein may be scaled proportionately or may be adjusted individually as appropriate to the circumstances of the electronic assembly in which the differential interconnect 106A or 106B is being applied. Further, while the differential interconnects 106A and 106B illustrated herein are the same dimensions, differential interconnects 106A and 106B in the same electronic assembly may incorporate varying dimensions.

The arrangements illustrated and described herein may permit the differential interconnects 106A and 106B to occupy an amount of space in the electronic assembly 200 the same or substantially the same as a differential interconnect that does not incorporate stub traces 120, Thus, in the above example, the minimum spacing between differential interconnects without stub traces 120 may still be approximately twenty (20) mil. In such an example, the minimum spacing between a differential interconnect and another component may be at least ten (10) mil. In such an example, the spacing requirement may apply to the transmission traces 108, 110 and the stub traces 120 with a length of 8.7 mil may not impact spacing or layout on the electronic assembly 200.

In an example, the differential interconnect 106A or 106B may provide a reduction in FEXT of approximately thirty-two (32) decibels over a differential interconnect that does not incorporate the stub traces 120 at five (5) gigahertz. The differential interconnect 106A or 106B may thus support a ten (10) gigabit per second data rate. While a differential interconnect without stub traces 120 may have approximately forty-five (45) millivolts of FEXT, the differential interconnect 106A or 106B may have little to no measureable FEXT. The differential interconnect 106A or 106B may have the same or substantially the same insertion loss as a differential interconnect without stub traces 120. The differential interconnect 106A or 106B may have a common mode conversion of approximately −45 decibels on a ten (10) inch (25.4 centimeter) channel.

In an example, the differential interconnect 106A or 106B has an eye height (i.e., peak-to-peak in an eye diagram) of approximately three hundred forty-nine (349) millivolts and an eye width (i.e., a time between the intersection of rising an falling edges in an eye diagram) of approximately 80.8 picoseconds at a data rate of ten (10) gigabits per second over a length of ten (10) inches (25.4 centimeters). The differential interconnect 106A or 106B may have an eye height of approximately two hundred thirty-eight (238) millivolts and an eye width of approximately sixty-four (64) picoseconds at a data rate of twelve (12) gigabits. The differential interconnect 106A or 106B may have an eye height of approximately 80.9 millivolts and an eye width of approximately 35.5 picoseconds at a data rate of sixteen (16) gigabits. The differential interconnect 106A or 106B may have performance improvement over a differential interconnect without stub traces 120 from approximately forty-three (43) millivolts to fifty (50) millivolts in eye height and from approximately 10.6 picoseconds to 15.9 picoseconds in eye width.

Figure 3:
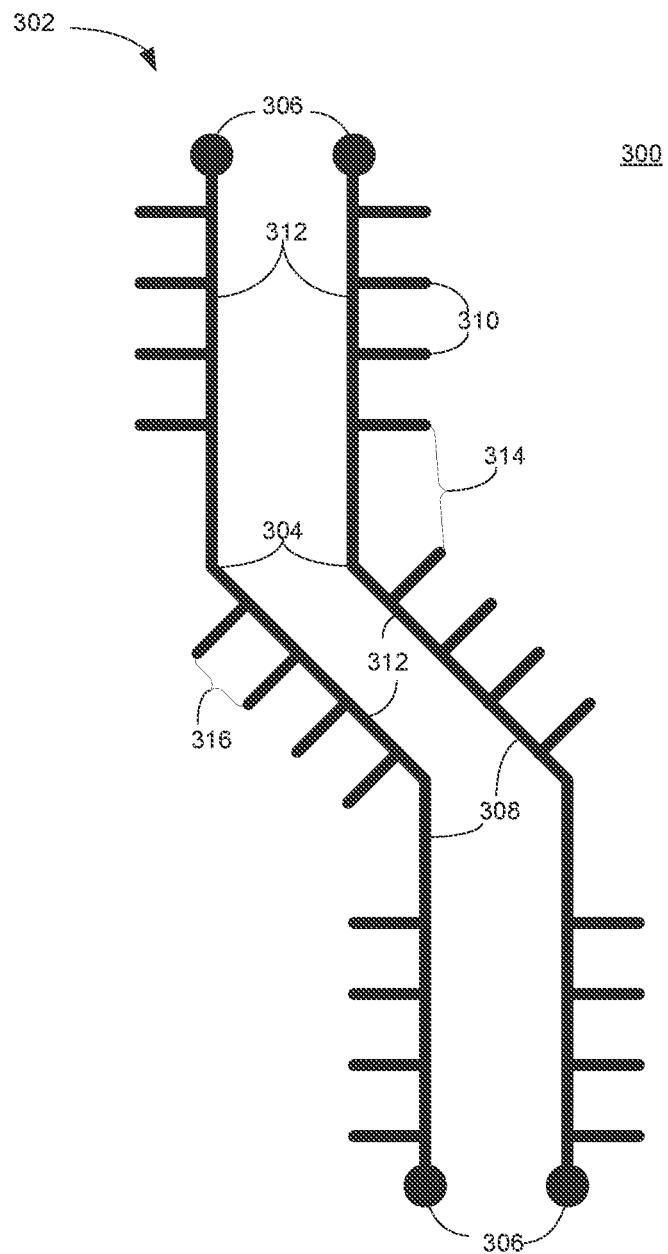
FIG. 3 is an illustration of a layer of a microelectronic assembly having a differential interconnect, in an example embodiment.

FIG. 3 is an illustration of a layer of a microelectronic assembly 300 having a differential interconnect 302, in an example embodiment. The differential interconnect 302 includes the basic properties of the differential interconnect 106 of FIG. 1 but also includes a bend 304 and vias 306. The vias 306 provide electrical connection between layers of the microelectronic assembly 300 and are, in the illustrated example, included as part of the differential interconnect 302. Electrical connection points, such as the electrical connection points 102 of FIG. 1, may be located on different layers of the microelectronic assembly 300 and may be coupled to the differential interconnect 302 on those layers. The differential interconnect 302 may thus extend through multiple layers of the microelectronic assembly 300 and may include transmission traces 308 on one or more of the layers and additional vias 306.

The stub traces 310 in proximity of the bends 304 in the transmission traces 308 may be arranged to prevent interference between stub traces 310. Thus, gaps between stub traces 310 may be greater proximate the bends 304 than straight segments 312 of the transmission traces 308. In an example, the spacing 314 between adjacent stub traces 310 over a bend 304 is at least ten (10) times greater than a lateral spacing 316 between adjacent stab traces 310 on a straight section 312 of the transmission line. It is noted that the instant drawing is not presented to the example scale, and that alternative spacing ratios are contemplated. In various examples, the difference in spacing between adjacent stub traces 310 over a bend 304 in comparison with along a straight segment 312 may be dependent on the characteristics of the microelectronic assembly in which they are implemented and desired performance.

Figure 4:
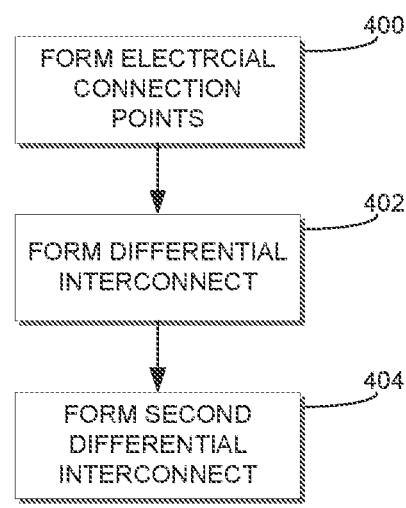
FIG. 4 is a flowchart for making a microelectronic assembly, in an example embodiment.

FIG. 4 is a flowchart for making a microelectronic assembly, in an example embodiment. The microelectronic assembly may be any of the microelectronic assemblies 100 of FIG. 1, 200 of FIG. 2, 300 of FIG. 3, or may be any microelectronic assembly that includes a differential interconnect 106 of FIG. 1.

At 400, a first electrical connection point and a second electrical connection point are formed.

At 402, a differential interconnect coupling the first electrical connection point to the second electrical connection point is formed. The differential interconnect includes a first transmission trace including a first interior edge and a first exterior edge opposite the first interior edge, a second transmission trace substantially parallel with the first transmission trace and including a second interior edge and a second exterior edge opposite the second interior edge, the second interior edge facing the first interior edge, and stub traces, each individual stub trace coupled to one of the first transmission trace and the second transmission trace and projecting from one of the first interior edge, the first exterior edge, the second interior edge, and the second exterior edge, wherein a substantially equal number of stub traces project from the first exterior edge and the second exterior edge, and wherein at least twice as many stub traces project from the first and second exterior edges as project from the first and second interior edges.

In an example, forming the differential interconnect includes extending the stub traces only from the first and second exterior edges. In an example, the stub traces extend substantially orthogonal to the first and second transmission traces. In an example, forming the interconnect includes forming the stub traces so that each of the stub traces have a substantially equal length. In an example, forming the interconnect includes forming the stub traces so that the stub traces form a substantially symmetric pattern between the first transmission trace and the second transmission trace.

In an example, the first and second transmission traces have a trace separation distance between the first and second transmission traces and wherein the stub traces have a stub trace length, wherein the trace separation distance is less than the stub trace length. In an example, the first and second transmission traces have a trace width and the stub traces have a stub trace width, the stub trace width approximately sixty percent the trace width.

At 404, a second differential interconnect is formed substantially parallel, at least in part, with the first differential interconnect, wherein stub traces of the second differential interconnect are interleaved with the stub traces of the first differential interconnect. In an example, forming the first and second interconnects includes forming the stub traces so that one of the stub traces of the second differential interconnect is approximately equidistant between adjacent ones of the stub traces of the first differential interconnect. In an example, the stub traces have a stub trace width, and wherein a lateral distance between the one of the stub traces of the second differential interconnect and the adjacent ones of the stub traces of the first differential interconnect is approximately four times greater than the stub trace width.

Figure 5:
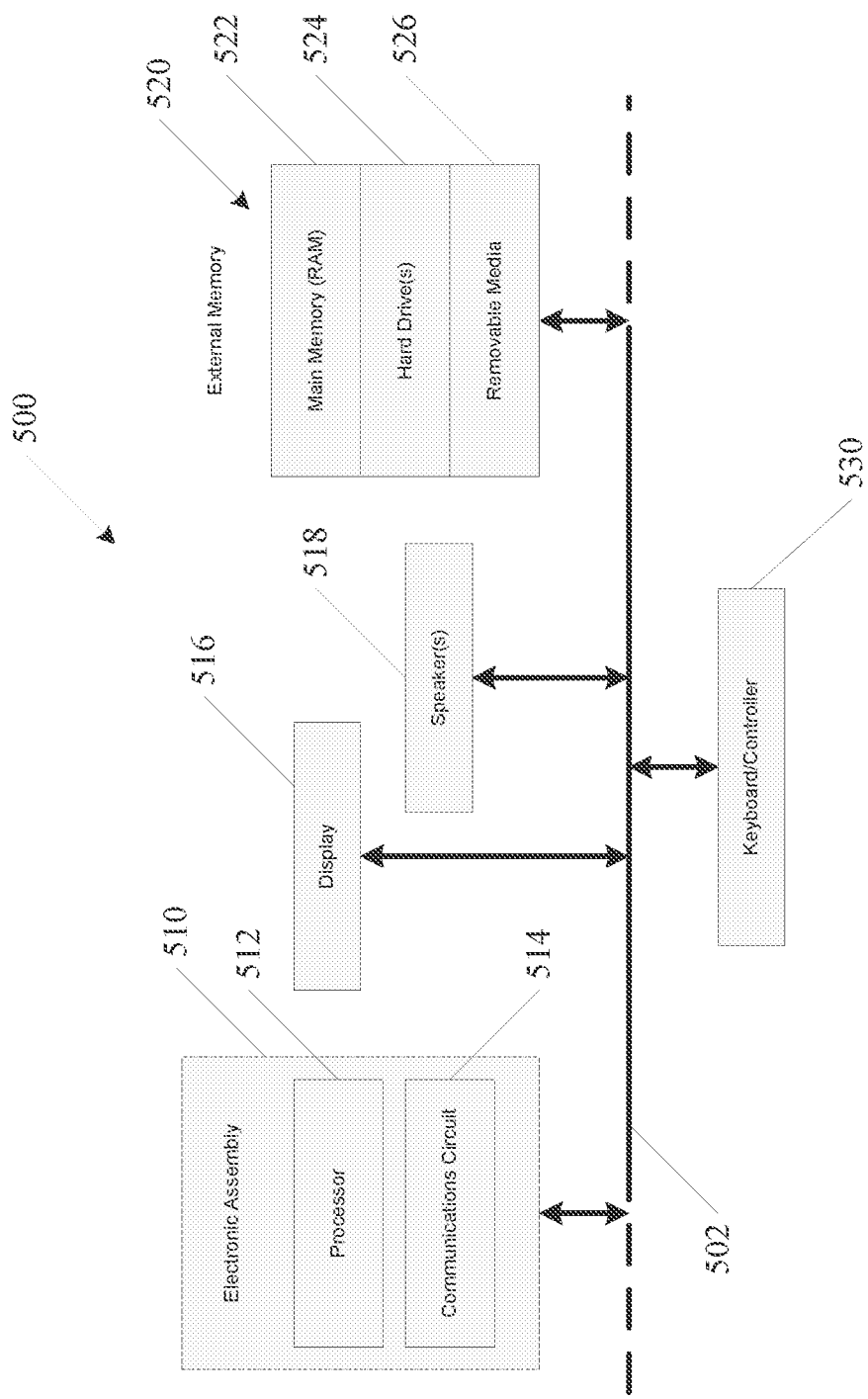
FIG. 5 is a block diagram of an electronic device incorporating at least one microelectronic assembly, in an example embodiment.

An example of an electronic device using electronic assemblies as described in the present disclosure is included to show an example of a higher level device application for the disclosed subject matter. FIG. 5 is a block diagram of an electronic device 500 incorporating at least one electronic assembly, such as an electronic assembly 100 of FIG. 1 or other electronic or microelectronic assembly related to examples herein. The electronic device 500 is merely one example of an electronic system in which embodiments of the present invention can be used. Examples of electronic devices 500 include, but are not limited to personal computers, tablet computers, mobile telephones, personal data assistants, MP3 or other digital music players, wearable devices, Internet of things (IOTS) devices, etc. In this example, the electronic device 500 comprises a data processing system that includes a system bus 502 to couple the various components of the system. The system bus 502 provides communications links among the various components of the electronic device 500 and can be implemented as a single bus, as a combination of busses, or in any other suitable manner.

An electronic assembly 510 is coupled to the system bus 502. The electronic assembly 510 can include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 510 are a custom circuit, an application-specific integrated circuit (ASIC), or the like, such as, for example, one or more circuits (such as a communications circuit 514) for use in wireless devices like mobile telephones, pagers, personal data assistants, portable computers, two-way radios, and similar electronic systems. The IC can perform any other type of function.

The electronic device 500 can also include an external memory 520, which in turn can include one or more memory elements suitable to the particular application, such as a main memory 522 in the form of random access memory (RAM), one or more hard drives 524, and/or one or more drives that handle removable media 526 such as compact disks (CD), digital video disk (DVD), and the like.

The electronic device 500 can also include a display device 516, one or more speakers 518, and a keyboard and/or controller 530, which can include a mouse, track connection, touch screen, voice-recognition device, or any other device that permits a system user to input information into and receive information from the electronic device 500.

ADDITIONAL EXAMPLES

Example 1 may include subject matter (such as an apparatus, a method, a means for performing acts) that can include a first electrical connection point and a second electrical connection point and a differential interconnect coupling the first electrical connection point to the second electrical connection point, the differential interconnect including a first transmission trace including a first interior edge and a first exterior edge opposite the first interior edge, a second transmission trace substantially parallel with the first transmission trace and including a second interior edge and a second exterior edge opposite the second interior edge, the second interior edge facing the first interior edge, and stub traces, each individual stub trace coupled to one of the first transmission trace and the second transmission trace and projecting from one of the first interior edge, the first exterior edge, the second interior edge, and the second exterior edge, wherein a substantially equal number of stub traces project from the first exterior edge and the second exterior edge, and wherein at least twice as many stub traces project from the first and second exterior edges as project from the first and second interior edges.

Example 2 may include the electronic assembly of Example 1, further including that the stub traces extend only from the first and second exterior edges.

Example 3 may include the electronic assembly of any one or more of Examples 1 and 2, further including that the stub traces extend substantially orthogonal to the first and second transmission traces.

Example 4 may include the electronic assembly of any one or more of Examples 1-3, further including that each of the stub traces have a substantially equal length.

Example 5 may include the electronic assembly of any one or more of Examples 1-4, further including that the stub traces form a substantially symmetric pattern between the first transmission trace and the second transmission trace.

Example 6 may include the electronic assembly of any one or more of Examples 1-5, further including that the differential interconnect is a first differential interconnect and further comprising a second differential interconnect substantially parallel, at least in part, with the first differential interconnect, wherein stub traces of the second differential interconnect are interleaved with the stub traces of the first differential interconnect.

Example 7 may include the electronic assembly of any one or more of Examples 1-6, further including that one of the stub traces of the second differential interconnect is approximately equidistant between adjacent ones of the stub traces of the first differential interconnect.

Example 8 may include the electronic assembly of any one or more of Examples 1-7, further including that the stub traces have a stub trace width, and wherein a lateral distance between the one of the stub traces of the second differential interconnect and the adjacent ones of the stub traces of the first differential interconnect is approximately four times greater than the stub trace width.

Example 9 may include the electronic assembly of any one or more of Examples 1-8, further including that the first and second transmission traces have a trace separation distance between the first and second transmission traces and wherein the stub traces have a stub trace length, wherein the trace separation distance is less than the stub trace length.

Example 10 may include the electronic assembly of any one or more of Examples 1-9, further including that the first and second transmission traces have a trace width and the stub traces have a stub trace width, the stub trace width approximately sixty percent the trace width.

Example 11 may include subject matter (such as an apparatus, a method, a means for performing acts) that can include forming a first electrical connection point and a second electrical connection point and forming a differential interconnect coupling the first electrical connection point to the second electrical connection point, the differential interconnect including a first transmission trace including a first interior edge and a first exterior edge opposite the first interior edge, a second transmission trace substantially parallel with the first transmission trace and including a second interior edge and a second exterior edge opposite the second interior edge, the second interior edge facing the first interior edge, and stub traces, each individual stub trace coupled to one of the first transmission trace and the second transmission trace and projecting from one of the first interior edge, the first exterior edge, the second interior edge, and the second exterior edge, wherein a substantially equal number of stub traces project from the first exterior edge and the second exterior edge, and wherein at least twice as many stub traces project from the first and second exterior edges as project from the first and second interior edges.

Example 12 may include the method of Example 11, further including that forming the differential interconnect includes extending the stub traces only from the first and second exterior edges.

Example 13 may include the method of any one or more of Examples 11 and 12, further including that the stub traces extend substantially orthogonal to the first and second transmission traces.

Example 14 may include the method of any one or more of Examples 11-13, further including that forming the interconnect includes forming the stub traces so that each of the stub traces have a substantially equal length.

Example 15 may include the method of any one or more of Examples 11-14, further including that forming the interconnect includes forming the stub traces so that the stub traces form a substantially symmetric pattern between the first transmission trace and the second transmission trace.

Example 16 may include the method of any one or more of Examples 11-15, further including that the differential interconnect is a first differential interconnect and further comprising forming a second differential interconnect substantially parallel, at least in part, with the first differential interconnect, wherein stub traces of the second differential interconnect are interleaved with the stub traces of the first differential interconnect.

Example 17 may include the method of any one or more of Examples 11-16, further including that forming the first and second interconnects includes forming the stub traces so that one of the stub traces of the second differential interconnect is approximately equidistant between adjacent ones of the stub traces of the first differential interconnect.

Example 18 may include the method of any one or more of Examples 11-17, further including that the stub traces have a stub trace width, and wherein a lateral distance between the one of the stub traces of the second differential interconnect and the adjacent ones of the stub traces of the first differential interconnect is approximately four times greater than the stub trace width.

Example 19 may include the method of any one or more of Examples 11-18, further including that the first and second transmission traces have a trace separation distance between the first and second transmission traces and wherein the stub traces have a stub trace length, wherein the trace separation distance is less than the stub trace length.

Example 20 may include the method of any one or more of Examples 11-19, further including that the first and second transmission traces have a trace width and the stub traces have a stub trace width, the stub trace width approximately sixty percent the trace width.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic assembly, comprising:
   a first electrical connection point and a second electrical connection point; and
   a first differential interconnect coupling the first electrical connection point to the second electrical connection point, the first differential interconnect including:
   a first transmission trace including a first interior edge and a first exterior edge opposite the first interior edge;
   a second transmission trace substantially parallel with the first transmission trace and including a second interior edge and a second exterior edge opposite the second interior edge, the second interior edge facing the first interior edge; and
   first stub traces, respective ones of the first stub traces coupled to corresponding one of the first transmission trace and the second transmission trace and projecting from corresponding one of the first interior edge, the first exterior edge, the second interior edge, and the second exterior edge, wherein a substantially equal number of first stub traces project from the first exterior edge and the second exterior edge, and wherein at least twice as many first stub traces project from the first and second exterior edges as project from the first and second interior edges; and
   a second differential interconnect substantially parallel, at least in part, with the first differential interconnect, wherein second stub traces of the second differential interconnect are interleaved with the first stub traces of the first differential interconnect.

2. The electronic assembly of claim 1, wherein the first stub traces extend only from the first and second exterior edges.

3. The electronic assembly of claim 1, wherein the first stub traces extend substantially orthogonal to the first and second transmission traces.

4. The electronic assembly of claim 1, wherein each of the first and second stub traces has a substantially equal length.

5. The electronic assembly of claim 1, wherein the first stub traces form a substantially symmetric pattern between the first transmission trace and the second transmission trace.

6. The electronic assembly of claim 1, wherein the first and second transmission traces have a trace width and the first and second stub traces have a stub trace width, the stub trace width approximately sixty percent the trace width.

7. The electronic assembly of claim 1, wherein one of the second stub traces of the second differential interconnect is approximately equidistant between adjacent ones of the first stub traces of the first differential interconnect.

8. The electronic assembly of claim 7, wherein the first and second stub traces have a stub trace width, and wherein a lateral distance between the one of the second stub traces of the second differential interconnect and the adjacent ones of the first stub traces of the first differential interconnect is approximately four times greater than the stub trace width.

9. The electronic assembly of claim 1, wherein the first and second transmission traces have a trace separation distance between the first and second transmission traces and wherein the first and second stub traces have a stub trace length, wherein the trace separation distance is less than the stub trace length.

10. A method of making a microelectronic assembly, comprising: forming a first electrical connection point and a second electrical connection point; and forming a first differential interconnect coupling the first electrical connection point to the second electrical connection point, the first differential interconnect including:

a first transmission trace including a first interior edge and a first exterior edge opposite the first interior edge;

a second transmission trace substantially parallel with the first transmission trace and including a second interior edge and a second exterior edge opposite the second interior edge, the second interior edge facing the first interior edge; and first stub traces, respective ones of the first stub traces coupled to corresponding one of the first transmission trace and the second transmission trace and projecting from corresponding one of the first interior edge, the first exterior edge, the second interior edge, and the second exterior edge, wherein a substantially equal number of stub traces project from the first exterior edge and the second exterior edge, and wherein at least twice as many stub traces project from the first and second exterior edges as project from the first and second interior edges; and forming a second differential interconnect substantially parallel, at least in part, with the first differential interconnect, wherein second stub traces of the second differential interconnect are interleaved with the first stub traces of the first differential interconnect.

11. The method of claim 10, wherein the first and second transmission traces have a trace separation distance between the first and second transmission traces and wherein the first and second stub traces have a stub trace length, wherein the trace separation distance is less than the stub trace length.

12. The method of claim 10, wherein forming the first differential interconnect includes extending the first stub traces only from the first and second exterior edges.

13. The method of claim 10, wherein the first stub traces extend substantially orthogonal to the first and second transmission traces.

14. The method of claim 10, wherein forming the first differential interconnect includes forming the first stub traces so that each of the stub traces has a substantially equal length.

15. The method of claim 10, wherein forming the first differential interconnect includes forming the first stub traces so that the stub traces form a substantially symmetric pattern between the first transmission trace and the second transmission trace.

16. The method of claim 10, wherein the first and second transmission traces have a trace width and the first and second stub traces have a stub trace width, the stub trace width approximately sixty percent the trace width.

17. The method of claim 10, wherein forming the first and second interconnects includes forming the first and second stub traces so that one of the second stub traces of the second differential interconnect is approximately equidistant between adjacent ones of the first stub traces of the first differential interconnect.

18. The method of claim 17, wherein the first and second stub traces have a stub trace width, and wherein a lateral distance between the one of the second stub traces of the second differential interconnect and the adjacent ones of the first stub traces of the first differential interconnect is approximately four times greater than the stub trace width.

* * * * *